United States Patent [19]
Berger et al.

[11] Patent Number: 5,316,879
[45] Date of Patent: May 31, 1994

[54] SUB-MICRON DEVICE FABRICATION USING MULTIPLE APERTURE FILTER

[75] Inventors: Steven D. Berger; James A. Liddle, both of Chatham, N.J.

[73] Assignee: AT&T Bell Laboratories, Murray Hill, N.J.

[21] Appl. No.: 913,508

[22] Filed: Jul. 14, 1992

[51] Int. Cl.$^5$ .............................................. G03F 9/00
[52] U.S. Cl. ...................................... 430/5; 430/311; 430/296
[58] Field of Search ................ 430/5, 22, 311, 321, 430/296

[56] References Cited

PUBLICATIONS

D. P. Kern, et al, *Microcircuit Engineering*, pp. 184–194, Academic Press, London (1985).
H. C. Pfeiffer, et al, *Microelectronic Engineering* 17, pp. 7–10, (1992).
H. C. Pfeiffer, *Scanning Electron Microscopy/1972, Part 2*, IIT Research Institute, Chicago, Illinois, Apri. 1972.
M. A. Sturans, et al, *J. Vac. Sci. Technol.* B6(6), pp. 1995–1998, Nov./Dec. 1988.
M. A. Sturans, et al, *J. Vac. Sci. Technol.* B8(6), pp. 1682–1685 Nov./Dec. 1990.
G. H. Jansen, et al, *Microcircuit Engineering*, pp. 166–176, Academy Press, London (1985).
H. Ohiwa, *J. Vac. Sci. Technol.*, 15(3), pp. 849–853, May/Jun. 1978.
H. C. Pfeiffer, et al, *J. Vac. Sci. Technol.*, 19(4), pp. 1058–1063, Nov./Dec. 1981.
M. A. Sturans, et al, *Microcircuit Engineering 83*, pp. 106–116, Academy Press, London (1983).

*Primary Examiner*—Steve Rosasco
*Attorney, Agent, or Firm*—George S. Indig

[57] ABSTRACT

Fabrication of sub-micron design rule integrated circuits entails imposition of patterning information, consisting of degree of scattering, on a projected scanning beam of accelerated electrons by means of a mask, imaging being dependent upon passage through a back focal plane filter including a plurality of apertures for selectively passing relatively unscattered electrons.

16 Claims, 2 Drawing Sheets

U.S. Patent     May 31, 1994     Sheet 1 of 2     5,316,879
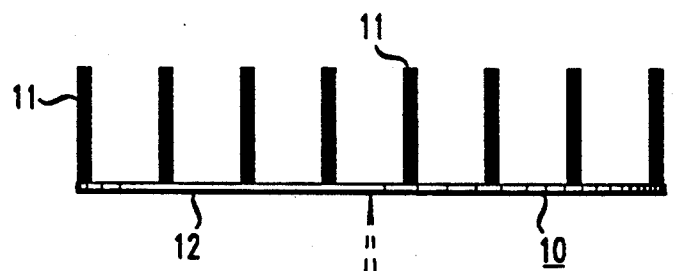
FIG. 1
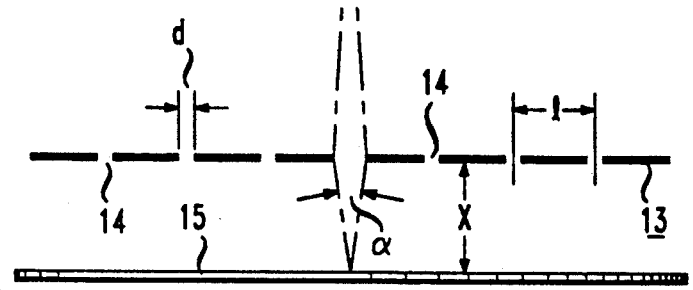
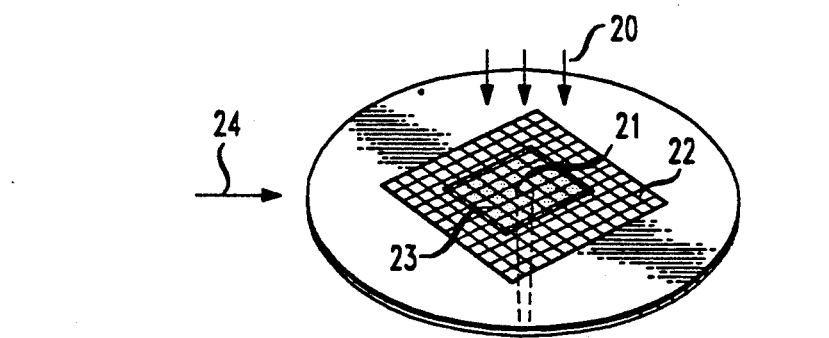
FIG. 2
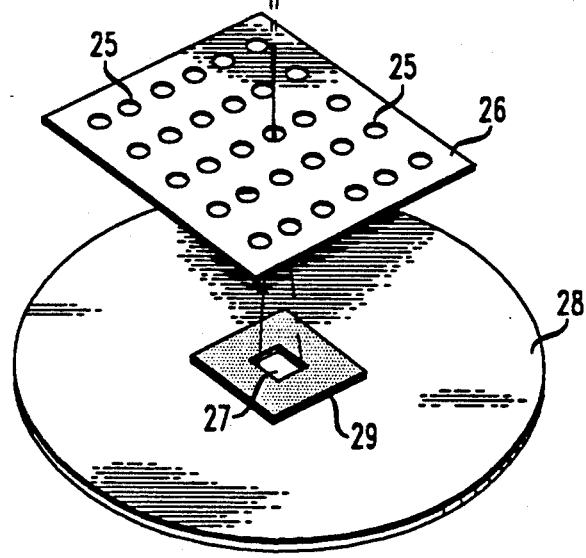

SUB-MICRON DEVICE FABRICATION USING MULTIPLE APERTURE FILTER

BACKGROUND OF THE INVENTION

1. Technical Field

The invention is concerned with a fabrication of devices best exemplified by Large Scale Integrated circuits built to submicron design rules, e.g. equal to or less than 0.5 μm. Relevant fabrication entails projection lithography using charged particle delineating energy—either electron or ion.

2. Terminology

It is useful to consider specific usage of certain terms in the context of the disclosure.

Optical Field—defines the field area—depending upon context, either for mask or wafer—corresponding with extreme values of angle of incidence of delineating rays (generally for delineating electron rays). It sometimes refers to maximum field permitting needed edge-to-edge resolution. It more generally refers to the actual area resulting from electronic beam scanning,—in one system, to the area electronically scanned before mechanical repositioning of mask or wafer to initiate the next electronic scanning step.

Scanning—as unmodified, refers to movement of the delineating particle beam under the influence of an applied field of varying magnitude. It does not refer to mechanical movement, e.g. of wafer or mask stage, which may be described as "mechanical scanning", "mechanical movement", etc. deBroglie Wavelength—has relavent implications described of the related property for electromagnetic radiation. It is defined as follows:

$$\lambda = h/p$$

in which:

$\lambda$ = deBroglie Wavelength
h = Planck's constant = $6.6 \times 10^{-27}$ erg-sec
p = momentum = mass × velocity Note: Description is generally in terms of electrons as operating in vacuum. Accordingly, accelerating field energy (e.g. ≈50–200 kV) is imparted to result in similarly energized electrons (e.g. to result in 50–200 key electrons). While there is some increase in effective mass of the electrons due to relativistic influence, this is largely ignored for purpose of this description.

Transfer of the same energy to ions results in smaller deBroglie wavelength. Since wavelength varies inversely as the square root of particle mass, increasing mass, e.g. by 1800×—the mass relationship for a proton relative to an electron—results in a $\lambda$ value which is approximately 1/42.5 of that of an electron at the same kinetic energy.

Back Focal Plane Filter—The position of this filter is at a cross-over. For the exemplary case of parallel or near-parallel illumination, the cross-over is on the back focal plane or on some equivalent conjugate plane of the lens system.

DESCRIPTION OF THE PRIOR ART

Considerable effort worldwide is directed to generations of LSI of design rules (minimum feature size and/or spacing dimension) smaller than the ≈1.0–0.9 μm design rule, and of chip size larger than the ≈1 cm², which characterize current production. It is expected that the present ≈1 Mbit chip will yield, in succession, to 4, 16, 64 Mbit—with decreasing design rule and increasing chip size playing approximately equal roles (e.g. decrease in design rule and increase in chip dimension, each by a factor of $\sqrt{2}$, together yielding twice the number of circuit elements in each of the x and y directions, to result in the anticipated, generation-by-generation, quadrupling of chip capacity).

The inventive teaching is directly concerned with design rule as limited by lithographic patterning. Presently used UV lithography—at this time in the "near-UV" spectrum ($\lambda \approx 365$ nm in present fabrication) will serve for somewhat smaller design rules—perhaps as aided by phase masking. (See, M. D. Levinson, et al., *IEEE Transaction on Electron Devices* "Improving Resolution in Photolithography with a Phase-Shifting Mask", vol. ED-29, No. 12, Dec. 1982.) Radiation in the "deep-UV" spectrum ($\lambda = 350$ nm to 150 nm) is expected to serve for fabrication of devices at design rules of 0.5 μm and smaller—possibly to ≈0.35 μm (expected to permit attainment of the 64 Mbit level chip).

For still smaller design rules, it is believed it will be necessary to pattern with delineating energy of shorter wavelength. Emergence of suitable short wavelength delineation may result in displacement of longer wavelength for somewhat larger design rules as well—perhaps for 0.5 μm or larger. Impetus may be improved device yield due to improved tolerance to non-ideal conditions as based on shorter wavelength itself, or as resulting from associated advances.

Initial and continuing effort makes use of electromagnetic energy of required shorter wavelength—of energy in the x-ray spectrum. A variety of problems have been addressed with some substantial success. Lens problems, to large extent due to limitations in refractive index in otherwise desirable materials, have led to emphasis on reflective optics. Reflectivities of suitable magnitude have been realized by use of multiple layered mirrors—by use of Distributed Bragg Reflectors. Distortions and aberrations of complex origin have led to a variety of scanning modes. A prominent source of distortion for projected images is due to variation in magnification with distance from the optic axis. Co-pending U.S. patent application Ser. No. 07/595,341, filed Oct. 10, 1990, depends upon ringfield scanning to accommodate this problem. In that approach, the completed pattern or pattern segment is produced by means of a narrow scanning arcuate slit of curvature defined by constant radial spacing from the optic axis.

Possibility of accelerated electron illumination in lieu of electromagnetic illumination for mask pattern delineation has not been overlooked. Transfer of the fundamental technology from electron microscopy to primary pattern delineation has resulted in the world-dominant approach to mask generation, as exemplified by the Electron Beam Exposure System. (See, M. Lepselter et al., *VLSI Electronics Microstructure Science*, ed. Norman G. Einspruch, Academic Press, pp. 108–114, 1981.) The same primary pattern generation has been used for direct beam writing of LSI patterns. This history has provoked studies directed to electron mask delineation.

*J. Vac. Sci. Technol.*, vol. 12, No. 6, Nov./Dec. 1975 describes one such effort by M. B. Heritage. As there reported, a 10× reduction projection system used an electron beam-illuminated foil mask with considerable success. Provision for parallel ray illumination over the mask area, together with equipment complexity/size to maintain aberrations at a tolerable level, were, however, quite costly.

Adaptation of scanning in electron masking is often ascribed to Takayuki Asai and coworkers. Their work is described in *Japanese Journal of Applied Physics*, vol. 19 (1980), Supplement 19-1, pp. 47–50, "1:4 Demagnifying Electron Projection System". They made use of a metal foil mask which was scanned with parallel ray electron illumination. They reported resolution of about 0.2 μm.

Work by H. W. Koops and J. Grob as reported in "X-ray Microscopy", *Springer Series in Optical Sciences*, vol. 43, G. Schmahl and D. Rudolph, eds. (1984), is based on this form of parallel ray scanning. Like Asai et al., feasibility of sub-micron pattern delineation is clearly demonstrated. The main disadvantage of the approach is in terms of equipment complexity/size.

U.S. Pat. No. 5,079,112 issued Jan. 7, 1992, describes and claims integrated circuit fabrication also based on electron beam lithography. A key feature substitutes scatter-nonscatter for absorption-transparency masking—an approach suited to use of apertured as well as non-apertured masks. Discrimination, as between scattered and unscattered radiation, is due to an expediently dimensioned apertured scatter filter positioned in the vicinity of the ray crossover plane before the wafer—with aperture generally on the optical axis for systems now receiving attention. The 50–200 kV accelerating voltage range desired for resolution and feature spacing offers image contrast at the 80% level and higher. The process is known as SCattering with Angular Limitation in Projection Electron-beam Lithography.

It is implicit that the SCALPEL approach lends itself to use in all of the many forms of charge particle delineation systems. An inherent advantage entails availability of small values of deBroglie wavelengths to reduce required precision in mask-to-wafer path length in attaining needed resolution. Proposed forms of SCALPEL take advantage of the processing freedom so offered—an advantage further supported by the fundamental character of SCALPEL. Use of scattering, rather than absorption, for mask blocking, in permitting thinner blocking regions, avoids resolution loss otherwise resulting from edge scattering at features on the mask. In one instance, a scanning system takes advantage of this improved depth of focus in terms of permitted variation in angle of incidence of the delineating radiation on the wafer surface. (See, co-pending U.S. patent application Ser. No. 07/852,272, filed Mar. 16, 1992.)

Reported work offers means for still further improvement in processing margin as offered by attainable short values of deBroglie wavelength. Both cell projection systems and scanning systems based on sequential projection of neighboring mask regions may further profit by any of a variety of approaches limiting aberrations due to non-coincidence as between beam axis and optical axis of a projection lens. Coincidence has been assured by Moving Objective Lens Systems, *J. Vac. Sci. Technol.*, 15(3), pp. 849–52, May/June 1978; by Variable Axis Lens Systems, *J. Vac. Sci. Technol.*, 19(4), pp. 1058–63, Nov./Dec. 1981; and by a species of VAL known as Variable Axis Immersion Lens, *Microcircuit Engineering* 83, ISBN 0.12.044980.3, pp. 106–116, Academic Press, London (1983); *J Vac. Sci. Technol.*, B6(6), pp. 1995–98, Nov./Dec. 1988; *J Vac. Sci. Technol.*, B8(6), pp. 1682–85, Nov/Dec 1990.

A problem attendant upon use of charged particle illumination concerns resolution loss due to charge-repulsion of such particles. To a significant extent, the same field-acceleration responsible for shortened de-Broglie wavelength lessens the effect. At the same time, substantial depth of focus so permitted translates into substantial field of view to minimize required mechanical movement in scanning modes. Disadvantages of blocking regions of increased thickness to accommodate increased absorption distances are generally avoided by use of scattering in accordance with the fundamental SCALPEL principle. Nonetheless, with attention being given to smaller and smaller design rules, particle repulsion imposes limits on current in the beam to, in turn, impose time limits—often to require exposure times which are both inexpedient and uneconomic.

Co-filed U.S. patent application Ser. No. 07/913,509, filed Jul. 14, 1992 is directed to use of dynamic correction, e.g. to accommodate varying focal distances inherent in scanning. One form of correction is based on the variable axis lens systems. Variation in axis position to track the scanning beam maximizes imaging area before need for mechanical stepping/scanning.

SUMMARY OF THE INVENTION

The invention takes advantage of the variable axis lens suggested in co-filed U.S. Patent application. As there described, the optical axis is made to track the scanning incoming beam so that the beam is always on the optic axis. Assurance of parallel rays as orthogonally incident on the image plane significantly increases permitted operating margins while allowing increased current importantly with sufficiently short focal distances to lessen particle-to-particle interaction. At the same time, non-parallel rays—as dictated by economic considerations may lead to use of converging beams in the illumination system—easily tolerated at appropriate particle acceleration values.

The inventive advance provides for still further increase in imaging area before mechanical movement. An increase by a factor of at least two—factors of 100 and greater have been realized—is due to use of multiple apertures for selective passage of unscattered radiation. Recognition of certain characteristics of charged particle delineation permit use of hundreds or even thousands of such apertures with retention of the resolution and other excellent properties of the fundamental approach.

The invention takes advantage of the fact that feasibly dimensioned apertures as well as feasible aperture-to-aperture spacing may result in retention of sufficient contrast in the image. As for size, a round aperture equal to or larger than the fundamental pupil of the system assures resolution—results in a "contrast-only" aperture. Spacing may be adequate to suit system needs without, itself, imposing any significant contrast limit. In a preferred embodiment, use is made of mask segments of otherwise appropriate dimensions, possibly as supported by struts to permit use of thin membrane mask segments while imparting stiffness to large area masks. Design criteria discussed permit use of but a single aperture per segment.

In many respects, the inventive approach is of characteristics quite similar to that of reported work. Accelerating voltages, studied experimentally, have been within the ≈50–200 kV range as appropriately used in the fundamental SCALPEL, process to result in a de- Broglie wavelength, $\lambda$, of 0.01 μm and smaller. Operation within this range virtually eliminates this parameter as prime limitation on resolution—on resolution at the submicron level to perhaps 0.1 μm design rule and smaller. It is expected that contemplated chips fabricated in accordance with the invention, may be at 256 Mbit and 1 Gbit levels.

Preferred embodiments of the invention depend upon process as well as apparatus considerations realizable with charged particle, rather than electromagnetic, patterning radiation. One of these is due to fundamental characteristics of electromagnetic lenses. For example, while curvature of field is accommodated by an attribute of the variable axis lens, further compensation may take the form of varying focal length. Similarly, ease of beam deflection may satisfy precision requirements for "stitching" of adjacent pattern regions.

Scanning is necessarily area-limited. It can never extend beyond the "optical field" as defined above. At this time, optical field values for $\approx 0.25$ μm design rule may be of area $\approx 1$ cm$^2$ for equipment of size/complexity motivating the approach. For smaller chip size this field may avoid need for mechanical movement between scanning steps—each of which may be sufficient to pattern the entire chip. Contemplated increase in chip area as discussed, unless accompanied by advances resulting in increased optical field size, may dictate larger apparatus or mechanical movement between scanning steps during fabrication of an individual chip. Regardless of such considerations, it is expected that most economic fabrication will entail mechanical stage movement. Wafer area will likely continue to exceed optical field size. Mechanical movement will likely continue to be useful, at least on chip-to-chip basis.

Consistent with discussion thus far, the inventive approach is primarily directed to use of a plurality of fixed apertures which lessens need for mechanical scanning—which may eliminate need for the filter scanning stage altogether. Simultaneous mechanical and electronic scanning are possible and may best serve fabrication objective. Alternatively, the multiple aperture filter of the invention may reduce mechanical movement—in some instances, for small chip/wafer—may avoid mechanical movement altogether during imaging. Another version of the invention contemplates mechanical scanning/stepping only subsequent to the now-extended electronic scanning.

U.S. Pat. No. 5,260,151, filed Dec. 30, 1991, hereby incorporated by reference, contemplates use of a strut segmented mask to accommodate both small mask thickness and large pattern area, thereby expediting small design rule device fabrication. In accordance with that application, stitching precision is furthered by provision of pattern-delineated borders within strut-defined segments. It is expected that early commercialization will entail use of such segmented masks.

BRIEF DESCRIPTION OF THE DRAWING

FIG. 1 is a diagrammatic view to which reference is made of discussion of design criteria of particular relevance with regard to aperture size and spacing as affecting contrast.

FIG. 2 is a diagrammatic view depicting an ongoing process with attention to field of view and implications on electronic and mechanical scanning capacity.

DETAILED DESCRIPTION

Figure 3:
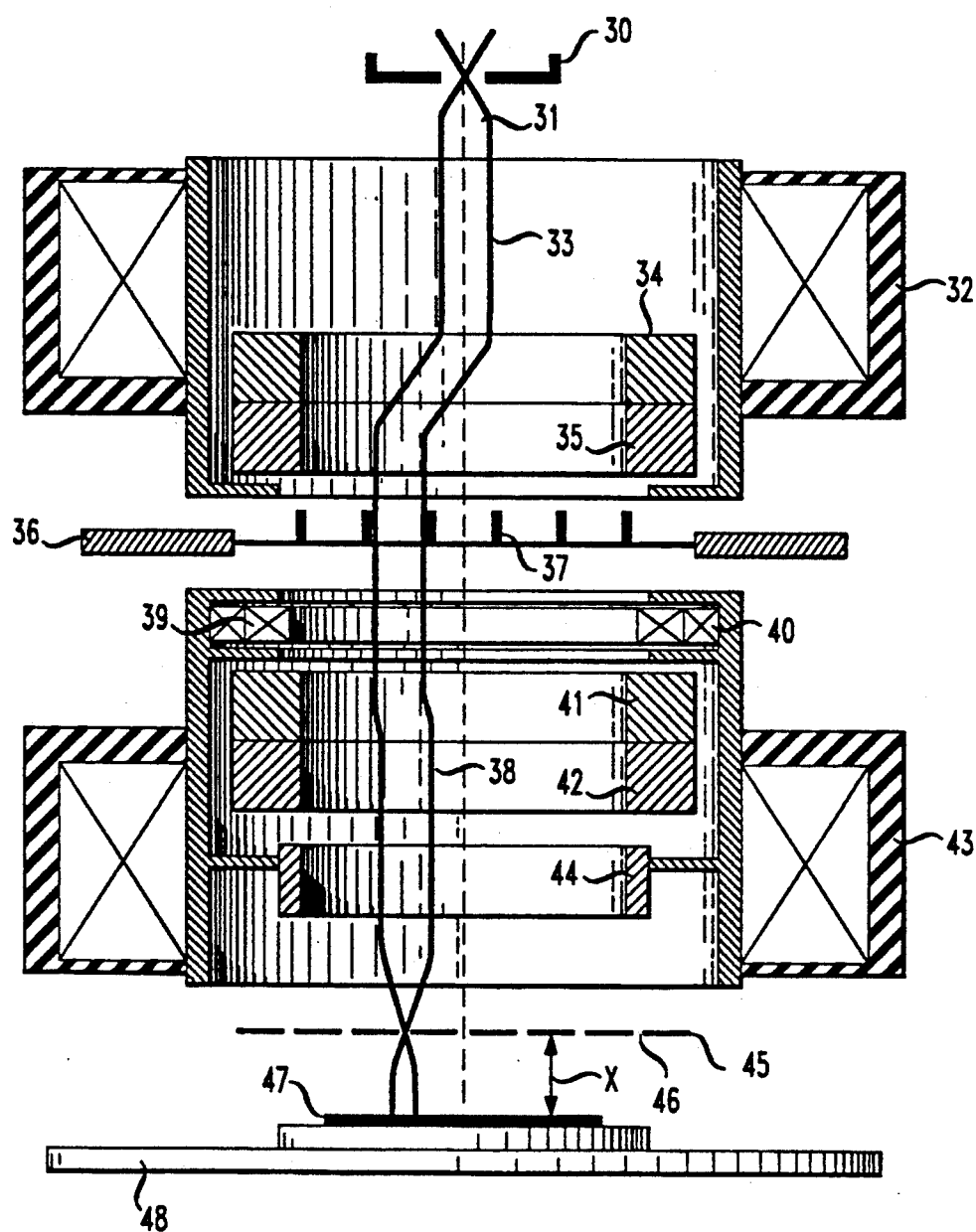
FIG. 3 is a schematic front elevational view showing a SCALPEL column employing a Variable Axis Immersion Lens.

For ease of presentation, the invention is largely discussed in terms of electron patterning—primarily by use of scatter-nonscatter masking in accordance with the "SCALPEL" process (as described in U.S. Pat. No. 5,079,112, issued Jan. 7, 1992). The inventive teaching is applicable to iori patterning. Other variations from specific description may be dictated. Detailed description of all such variations is not considered appropriate to the present disclosure.

Consistent with general expectation, description is in terms of a projection system dependent upon mask-to-wafer demagnification, perhaps of 4:1-5:1. Of course, the inventive approach is equally applicable to 1:1 as well as to other ratios. Magnification, while not receiving much present day attention, may profit by use of the inventive teaching as well.

It has been noted that the inventive advance takes advantage of use of "contrast only" apertures—an advantage largely retained with otherwise feasible spacings on a multiple-apertured filter. Reference is made to FIG. 1 in discussion of relevant design considerations. Not shown is the particle source and other apparatus required for proper illumination or imaging of the mask. Such apparatus may, as depicted on FIG. 3, consist of e.g. an electron gun, together with collimator lens and scan deflection yokes required for illumination of desired mask regions.

Mask 10, as provided with struts 11, thereby defining segments 12, is representative of a preferred embodiment. This preferred embodiment, likely as provided with orthogonal struts not shown, results in a form of the strut-segmented mask of co-pending U.S. Pat. No. 5,260,151, filed Dec. 30, 1991, hereby incorporated by reference. As claimed in that application, stitching precision is assured by lithographically defined borders within strut segments. It is expected that significant commercialization will, at least initially, make use of such masks. While usefully discussed in these terms, other mask forms are useful, and may permit alternative modes of operation. For example, absence of struts may permit greater reliance on continuous scanning relative to stepping.

Filter 13 is provided with apertures 14, each of transverse dimension, d. It is expected that usual operation will be based on round apertures (of diameter no smaller than the system pupil). A variety of considerations may take advantage of tolerance for non-round apertures— e.g. use of silicon or other crystallographic mask material may lead to etch-defined regions of rectangular or other non-round shape. While shown with aperture-to-aperture pitch, l, equal to spacing between struts 11, it is likely that commercial operation will make use of mask-to-image reduction, in which event pitch as well as aperture size are accordingly reduced.

Also depicted is wafer 15 as spaced at distance, X, from filter 13.

An essential aspect of the invention, aperture size and pitch to yield desired contrast, is determinable from the relationship:

$$K = \frac{\pi d^2}{4l^2}$$ EQ. 1

-continued or $$l = \sqrt{\frac{\pi d^2}{4K}}$$

in which:
  d = aperture size (in this instance, diameter of a round hole)
  l = aperture pitch (aperture center-to-aperture center spacing)
  X = separation of aperture filter 13 from wafer 15 and
  K is as defined—so that K represents loss in contrast.

Values of aperture size and pitch, otherwise appropriate, yield values of K within the range of up to 10%, e.g. 1%–10%—to result in substantial contrast retention relative to single aperture filters.

Aperture size is in accordance with the relationship:

$$d = \alpha X \qquad \text{EQ. 2}$$

in which:
  α = the angle subtended by the beam 16 at wafer 15 and
  d and X are as above defined.

Illustratively, the value of angle a may be within the range of 1–10 mrad for a distance, X = 10–100 mm.

The size of the system pupil (or numerical aperture) is in accordance with known considerations to optimize aberration, diffraction and particle-to-particle effects. (See, e.g., H. C. Pfeiffer, *Scanning Electron Microscopy*/1972 (*Part* 1), IIT Research Institute, Chicago, Ill., April 1972.)

Aperture size, so long as at least equal to that of the pupil, may be of any size consistent with constraints imposed in accordance with the relationships of EQ. 1 and 2. As above noted, it then functions solely as a contrast aperture and has no influence on the optical performance of the system in terms of its resolution.

Typical values of systems studied are l = 250 μm, α = 5 mrad, X = 10 mm, d = 50 μm so that K = 3.1%.

FIG. 2 depicts operation for a reduction process entailing the usually contemplated optical field of view which is smaller than that of the mask. The particular process shown provides both for mask-to-wafer reduction as well as for mechanical scanning simultaneous with electronic scanning. As depicted, illumination, e.g. accelerated electron illumination 20 is shown as illuminating mask segment 21 as defined by mask grillage 22. Mask segment 21 is contained within the optical field as represented by shaded mask region 23. Mechanical scanning in the x direction (from left to right as shown) is represented by arrow 24. Orthogonal scanning, in the y direction, may be sequential or simultaneous. The electronically scanning beam for the stage shown, passes through one of apertures 25 in aperture filter 26, with cross-over on the aperture filter plane to expose segment 27. As imaged on wafer 28, consistent with image reduction, both segment 27 being exposed and the optical field 29, again shown as a gray area, are reduced in size. As depicted, filter 26 consists of x-skewed apertures to accommodate continuous, simultaneous, x-direction mechanical scanning. This is in accordance with a likely arrangement providing for continuous x-direction scanning of the mask and wafer, with y-direction stepping to accommodate a mask which is larger than the optical field in that direction as well. In accordance with this arrangement, there would be no electronic scanning during y-direction mechanical movement. Alternatively, there may be provision for simultaneous y-direction mechanical scanning as well, in which event, apertures 25 should be skewed in that direction as well.

The invention, as discussed, is dependent upon use of multiple-aperture filter. In other respects, design may be in accordance with any of the variations in the technical and patent literature. Design as appropriate to the inventive teaching, as implemented on any such variation as well as future variations, is discussed in terms of FIG. 3. Apparatus shown includes a particle source 30, discussed as an electron gun, delivering electron beam 31. Collimator lens 32 brings the initially diverging rays into parallel relationship at 33 as shown. Scan deflection yokes 34 and 35 are responsible for electronic scanning, e.g. with continuous x-direction scanning as resulting from one yoke. The second yoke provides for y-direction movement, either continuous or as stepped intermediate x-direction scans. Mask 36, as depicted again in terms of a preferred embodiment, is shown as segmented by struts 37. Upon passing through the mask, the now pattern-containing beam 38, comes under the influence of dynamic focus and stigmator yokes 39 and 40. As suggested, focal length and other required adjustment at this stage may lessen required mechanical movement. Stitching deflector yokes 41 and 42 provide for a precision in placement of adjoining regions during x- and y-electronic scanning/stepping.

Projection lens 43, as provided with variable access lens yoke 44, is shown in the form of the now-preferred immersion variation, VAEL. Multiple aperture filter 45 including apertures 46, in this instance shown as of reduced pitch relative to mask 36, positioned on the cross-over plane is at such spacing, X, as to result in a focused image on wafer 47 shown atop wafer stage 48. As discussed, for illustrative purposes, mask 36 is shown as constituted of pattern regions corresponding with strut-separated segments as in co-pending U.S. Pat. No. 5,260,151, filed Dec. 12, 1991 likely with the embracing skirts, not shown, described in that case. Following modulation which imparts patterning information on the beam during passage through mask 36, the beam is converged, finally reaching a crossover (or image inversion) on or near the plane defined by aperture filter 46. As discussed, the aperture filter is included for electron imaging for blocking unwanted scattered radiation as in SCALPEL. It may serve, as well, to block other "noise"—e.g. by blocking unwanted feature-edge scattered radiation.

As elsewhere in the disclosure, little emphasis is placed on apparatus design features not directly relevant to the inventive teaching. As an example, an aperture 46, included for the primary purpose indicated, may define—may itself serve as—the numerical aperture (or pupil) of the system.

The projector lens system may include other elements, e.g. may include a doublet of two optically equivalent lenses, in operation oppositely polarized to inherently cancel corresponding aberrations implicit to design or operation common to the two. (Consistent with usual practice, the hardware responsible for generation of the functional shaped field is, itself, referred to as the "lens".)

As depicted, scanning is the primary responsibility of paired yokes 34 and 35 for x- and y-direction scanning. Such deflector pairs may serve, too, for precise adjustment of beam position, to themselves, or together with other elements, assure registration/alignment. Shown schematically as rectangles, they likely consist of electromagnetic deflection coils, although they may be based on electrostatic deflection, or a combination of both, as well. In either event, design criteria are well-known—see, for example, Ludwig Reimer, "Transmission Electron Microscopy", *Springer Series in Optical Sciences,* vol. 36, pp. 19–49.

Dynamic correction for aberration as well as for focusing, e.g. correcting for wafer height variation as well as field curvature, is advantageously accomplished by coreless lenses 39 and 40. Assigning responsibility for dynamic adjustment to these lenses speeds the process by lessening inductive lag time.

Upon emerging from projection lens system 43, and passing through an aperture 46, is made incident on wafer 47.

The system receiving experimental attention provides for mechanical scanning both of mask 13 and of wafer 27. For the system depicted—likely conforming with first commercialization—the first form of mechanical scanning may be continuous, either the same or opposite in direction for the two, and at rates accommodating demagnification, e.g. at 4:1 to 5:1 for mask and wafer, respectively. A second form of mechanical movement provides for fabrication in which a single mask pattern or region is stepped, to result in repeated exposure on the wafer. The objective may be satisfied by movement of mask or wafer alone or a combination of the two.

Design criteria for condenser and projector lenses and other parts of the system, e.g. including scan coils and deflectors, are at an advanced state of design as used, for example, in direct-write Electron Beam Exposure Systems as well as in electron microscopy. (See, for example, Ludwig Reimer, "Transmission Electron Microscopy", *Springer Series in Optical Sciences,* vol. 36, pp. 19–49, for design considerations appropriate to the inventive use.)

Reference is made to FIG. 3 in a general description of the inventive operation. While the figure is suitable for this purpose, it does not depict a variety of elements familiar to the artisan and serving in actual operation. For example, dynamic aberration correction may entail additional deflectors compensating for errors resulting from equipment/process defects. Lens systems, too, are illustrative—may include additional elements.

General

The inventive processes benefit by two attributes of charged particle delineation as afforded by electrons, e.g. by use of SCALPEL, as well as by ions. The first is the permitted reduction in wavelength—for electrons, to dimensions perhaps one or two orders of magnitude shorter than or competing electromagnetic delineation—far shorter for ions. (The comparison is for x-ray in the design rule regime of $\approx 0.25$ μm or smaller.) The second is the charged nature of the particles. Together they permit the non-normal incidence of delineating radiation with respect to the surface being patterned, and the facility for dynamically adjusting electronically to assure lithographic quality, e.g. registration/alignment as well as focusing.

Relaxation of demands related to depth of focus accommodates the varying ray path length corresponding with instantaneous delineation of a pattern region of significant area as operating from a fixed particle source—a source conveniently considered as a point source.

For contemplated near-term design rules, perhaps down to 0.1 μm, accelerating fields within the $\approx 50$–200 kV voltage range for otherwise suitable apparatus design, instantaneously exposed areas may be of a few or several square millimeters, e.g. of 25 mm$^2$. Such areas may correspond with segment size, as otherwise dictated, for example, in accordance with one of the strut-supported mask approaches of the above-noted U.S. Pat. No. 5,260,151. (The allusion, is to a square or, more generally, to a low aspect-ratio rectangular segment The effectively one-dimensioned chip-length segment—the high aspect-ratio segment resulting from use of non-intersecting parallel struts—profits both from this invention and from that of the co-pending case as well.)

Dynamic adjustment, as for positioning and focusing, expedites stepping/scanning both with regard to continuous mask patterns and to discontinuous patterns (e.g. strut/skirt separated patterns) and also expedites cell projection (entailing repetitive use of one or more segments for part of or for the entirety of an image or die).

It is convenient to consider the above embodiment, particularly in terms of instantaneous overall segment exposure with dynamic adjustment for segment-to-segment stepping. Other considerations may lead to variations. Wavelength/design rules may permit stepping, at least as between adjacent segments, without focusing change—perhaps without positional adjustment. Circumstances may not require segment-by-segment focusing change. Experimentally established conditions resulting in optical field size of $\approx 1$ cm$^2$ (for particular design rules and apparatus) permit a significant number of segment-by-segment steps without refocusing.

A contemplated approach is based on ray scanning between or perhaps serving the function of stepping. A likely application is in patterning of the "one dimension", e.g. chip pattern length segment in which scanning may be, e.g. by means of a beam of sufficient width to instantaneously expose the entirety of the short dimension while scanning the long.

Discussion is largely in terms of exposure—likely cumulative exposure to pattern a complete chip before moving on to the next. Other considerations may dictate exposure to define a sequence of partial patterns—e.g. to define a corresponding fractional region for one or more of the entire repeating series of such patterns in one dimension across an entire wafer—as directly or indirectly followed by patterning of the adjacent fractional region, etc. Other conditions may be taken into account in determining detailed operation. For example, minimization of temperature differentials to reduce problems associated with mask or wafer distortion may be accomplished by such repeated partial area exposures of individual instantaneously exposed regions.

For the most part, beam scanning has been discussed in terms of the fundamental objective—that of pattern exposure. Factors such as stage movement, as well as a variety of distortion/aberration-inducing variations, may impose demands requiring adjustment in scanning. For example, embodiments entailing step-by-step exposure rather than continuous scanning, while in principle, requiring no beam scanning or even mechanical scanning, during exposure of a given region may use, likely slower, beam scanning during exposure of a region to e.g. expedite pattern stitching.

Illustrative Process Parameters

Process and apparatus are first discussed in terms of electron delineation—e.g. SCALPEL—for otherwise characteristic parameter values. To large extent, such values are determined by resist characteristics—primarily sensitivity—together with source brightness and lens power. Values discussed are commensurate with present state-of-the-art availability. Experimental verification relates to an individual mask segment size of 1 mm². Depending on the position of the aperture plate with respect to deflection field/s, pitch (aperture-to-aperture spacing) is variable within the combined permitted range of mask pitch and image pitch. As discussed, the relatively slow mechanical movement required to reposition as between scan areas of a given pattern, may be avoided under presently attainable conditions which provide for optical field values sufficient to accommodate a total chip pattern.

Fabrication of devices to the small design rules contemplated places large demands on precision. The inventive teaching, while most importantly responsive to such needs, requires relative freedom from distortion—e.g. from temperature-gradient induced distortion. At this time, region-by-region beam dwell time, as required for convenient resist/particle brightness, is found to result in rate—or, alternatively, in yield-consequential mask distortion if uncompensated. An approach for alleviating this problem involves the more even heat distribution accompanying repeated region-by-region partial chip exposures, discussed above. Alternative, as well as supplemental cooling, is useful. Apparatus approaches to effectively accomplish the objective are known. Generally, it is sufficient to reduce temperature gradient-induced distortion to ≈20% of the design rule.

In summation, particularly for small chip patterns, delineation of the entirety of the pattern may entail but a single scanning step—but one optical field. Depending upon the size of the optical field, delineation of a chip pattern of size exceeding a single optical field may not require mechanical movement—may be accomplished with greater dependence on dynamic focusing. Under circumstances where such pattern is of area which exceeds the optical field, delineation requires mechanical movement as well as scanning. Required precision in alignment and registration under these circumstances is satisfied by accompanying field adjustment in positioning of the beam. In fact, mechanical movement, whether gradual or stepwise, is generally accompanied by field adjustment. In the instance of pattern-to-pattern, field adjustment in between independent patterns may be solely for assurance of registration relative to previous and sequential patterning levels.

Use of variable positioning of the optic axis, as noted, increases operating margins. Use of permitted short deBroglie wavelengths—values perhaps as small or smaller than one-tenth of that theoretically required, as based on wavelength limited resolution—increases freedom from a variety of causes. While the invention provides for angle of incidence for delineating radiation approaching or equal to 90°, some deviation may be tolerated. Accordingly, while the advance does not depend upon skewing as attendant upon scanning, needed precision with regard to landing angle (deviation from normal incidence or "skew") is relieved.

The intrinsic advantage afforded by attainable depth of focus may continue to accommodate height variations on the image plane. Such variations may be the consequence of previous processing—as due to development following exposure of preceding image levels.

Relationship Between Parameters

For one angular value of the numerical aperture, n.a., (as measured at the image plane—generally the plane of the wafer surface), depth of focus, D, of the system in vacuum is given by:

$$D = \pm \frac{\lambda}{8\sin^2 \frac{n.a.}{2}} \qquad \text{EQ. 4}$$

where $\lambda$ is the deBroglie wavelength of the particle beam, e.g. of the electron beam. For small values of n.a. this approximates to, $$D = 0.5 \frac{\lambda}{n.a.^2} \qquad \text{EQ. 5}$$

For one set of proposed conditions, n.a.=0.4 mrad and $\lambda$=0.045Å—a value corresponding with an accelerating voltage of 70 kV—the numerical value for depth of focus, D, is ±14 μm, Small unintended mechanical wafer movement is of little impact. Permitted registration error resulting from non-orthogonal illumination of the wafer may be calculated from the equation:

$$\Delta h = \pm \frac{e}{\tan\alpha} \qquad \text{EQ. 6}$$

in which:

$\Delta h$ = permitted variation in height, e.g. of the wafer surface e = permitted maximum registration error from this source.

For 0.15 μm design rule, the total overlay budget (the total permitted registration error) may correspond with the experimentally suitable 0.05 μm value. Assuming 0.01 μm error from this source, the permissible variation in landing angle is the value of $\alpha$ in EQ. 6.

In simplest terms, the inventive requirement regarding the multiple aperture filter is satisfied by use of but two apertures. Satisfaction of aperture size and spacing, as discussed, permits doubling of image size without loss of resolution associated with single aperture processing. It is expected that most operation win entail many apertures—at least one hundred. While variation is possible—and may suit particular needs—apertures will ordinarily be equally spaced at least as regarded in a particular rectalinear direction. As discussed in connection with FIG. 2, apertures may be placed non-rectalinearly—may be skewed in one or both directions to accommodate simultaneous mechanical scanning—to accommodate continuous mechanical scanning during electronic scanning.

Basic relationships determinative of aperture size and spacing have been set forth. Illustratively, in fabrication using design rules from 0.3 to 0.1 μm, contrast 90% of that attainable for single aperture is retained for round apertures of diameter, 90 μm as spaced 250 μm. In general, consideration of fundamental as well as practical factors, lead to likelihood of apertures in the diameter range of from 36 μm to 360 μm as spaced at 100 μm to 1000 μm, respectively.

Consistent with the approach taken, detailed information regarding design and operation of a VAIL lens, or more generally a VAL lens, is not presented—reliance is had, for example, on the cited literature (as with other background information not directly concerning the inventive advance). For brevity, the variable axis lens is considered as serving as a projection lens—likely the final imaging—focusing lens before the wafer. While it is expected that the projection lens win have provision for such positional adjustment of its axis, it is possible that other lenses in the system will be so provided as well. Ibis may be true of any other lenses in the imaging system itself, as well as of any illumination lenses.

We claim:

1. Method for fabrication of a device of feature size corresponding with design rule of a maximum of 0.5 μm, comprising at least one lithographic delineation step comprising illuminating a plurality of imaging regions of a mask by an electronically scanning beam of charged particles so that imaging information is imposed on such beam by two types of mask imaging regions, differing with regard to degree of scatter imposed on such beam, so as to produce a projected image on a device in fabrication by use of a lens system including a projection lens, said particles emanating from a particle source and being accelerated to a velocity resulting in a deBroglie wavelength, λ, of a value sufficient to satisfy design rule requirements, the transmission path for patterned radiation including a "back focal plane filter", defined as positioned on the back focal plane or on some equivalent conjugate plane of such lens system, said filter including an aperture defining the pass portion of said filter, characterized in that such beam during electronic scanning is maintained substantially on axis with regard to such projection lens by corresponding variation of the shape of such lens, in which the filter includes at least two apertures of size and separation to maintain desired image contrast and in that the delineation step entails image projection through at least two such apertures.

2. Method of claim 1 in which such charged particles consist essentially of electrons and in which such projection lens is a Variable Axis Immersion Lens.

3. Method of claim 2 in which electrons are accelerated by use of an accelerating field of a magnitude within the range of 50–200 kV.

4. Method of claim 1 in which said filter includes at least one hundred apertures.

5. Method of claim 1 in which apertures, are substantially circular in cross-section as viewed normal to the beam, are of diameter of a minimum equal to the pupil size of the lens system, and in which separation is such as to result in the contrast loss, K, of a maximum of 10% in accordance with the relationship:

$$K = \frac{\pi d^2}{4l^2}$$

in which:
d = aperture size (in this instance, diameter of a round hole)
l = aperture pitch (aperture center-to-aperture center spacing).

6. Method of claim 5 in which the mask and filter are physically moved relative to each other in a direction orthogonal to the beam during fabrication.

7. Method of claim 6 in which physical movement includes physical scanning during electronic scanning of the beam.

8. Method of claim 6 in which physical movement includes physical stepping, such stepping being intermediate electronic scanning procedures.

9. Method of claim 7 in which such physical scanning is essentially unidirectional and in which physical movement includes physical stepping in a direction essentially orthogonal to such physical scanning.

10. Method of claim 1 in which means is provided for changing physical position of the axis of at least one additional lens.

11. Method of claim 1 in which said lithographic delineation step comprises illuminating a plurality of segments of the device sequentially.

12. Method of claim 11 in which such a mask is comprised of sequentially spaced segments corresponding in position with that of such segments of the device.

13. Method of claim 11 in which at least some of such mask segments constitute segments of a continuous mask pattern.

14. Method of claim 11 in which imaging information is imposed on such beam be means comprising at least once repeating illumination of a portion of such mask so that at least some of the segments of the device are repeated.

15. Method of claim 1 in which illumination of the said plurality of segments of the device is temporally sequential.

16. Method of claim 1 in which illumination of portions of the said segments of the device is temporally non-sequential.

* * * * *